(12) United States Patent
Li et al.

(10) Patent No.: US 12,512,417 B2
(45) Date of Patent: Dec. 30, 2025

(54) METHOD AND STRUCTURE FOR DETERMINING AN OVERLAY ERROR

(71) Applicant: IMEC VZW, Leuven (BE)

(72) Inventors: Waikin Li, Leuven (BE); Zheng Tao, Heverlee (BE); Min-Soo Kim, Kessel-Lo (BE)

(73) Assignee: Imec vzw, Leuven (BE)

( * ) Notice: Subject to any disclaimer, the term of this patent is extended or adjusted under 35 U.S.C. 154(b) by 618 days.

(21) Appl. No.: 18/068,839

(22) Filed: Dec. 20, 2022

(65) Prior Publication Data

US 2023/0207482 A1    Jun. 29, 2023

(30) Foreign Application Priority Data

Dec. 24, 2021    (EP) .................................... 21217706

(51) Int. Cl.
| | |
|---|---|
| *H01L 23/544* | (2006.01) |
| *H01L 21/66* | (2006.01) |
| *H10D 30/43* | (2025.01) |
| *H10D 30/63* | (2025.01) |

(Continued)

(52) U.S. Cl.
CPC ............ *H01L 23/544* (2013.01); *H01L 22/20* (2013.01); *H10D 30/43* (2025.01); *H10D 30/63* (2025.01); *H10D 30/6735* (2025.01); *H10D 62/119* (2025.01)

(58) Field of Classification Search
CPC ............ G03F 7/70633; G03F 7/70683; G03F 9/7084; G03F 9/7088; G03F 7/70653; H01L 21/681; H01L 22/12; H01L 22/20; H01L 22/34; H01L 23/544; H10D 30/43; H10D 30/435; H10D 30/501–509; H10D 30/63; H10D 30/6704; H10D 30/6728; H10D 30/6735; H10D 30/674;

(Continued)

(56) References Cited

U.S. PATENT DOCUMENTS

| | | |
|---|---|---|
| 9,093,458 B2 | 7/2015 | Amir et al. |
| 9,165,889 B2 | 10/2015 | Ortner et al. |
| 9,311,443 B2 | 4/2016 | Chidambarrao et al. |

(Continued)

FOREIGN PATENT DOCUMENTS

CN    108269914 B    10/2019

OTHER PUBLICATIONS

Extended European Search Report and Written Opinion, Application No. EP 21217706.7, mailed Jun. 29, 2022, 6 pages.

(Continued)

*Primary Examiner* — Cheung Lee
(74) *Attorney, Agent, or Firm* — McDonnell Boehnen Hulbert & Berghoff LLP

(57) ABSTRACT

A semiconductor structure includes a device area that includes a first structure in a first layer having a top surface above a top surface of the first layer, and a second structure in a second layer on top of the first layer, where the first structure is pinned in the second structure; an overlay metrology area for optically evaluating an overlay error between the second and first structure, including: a third structure in the first layer, having a top surface above the top surface of the first layer, a fourth structure in the second layer, where the combination of the third and fourth structures mimics the combination of the first structure and the second structures, and a fifth structure in the first layer, for use as a reference structure.

20 Claims, 4 Drawing Sheets

(51) Int. Cl.
*H10D 30/67* (2025.01)
*H10D 62/10* (2025.01)

(58) Field of Classification Search
CPC .... H10D 62/119; H10D 62/121; H10D 84/01; H10D 84/0126; H10D 84/0158; H10D 84/038
See application file for complete search history.

(56) References Cited

U.S. PATENT DOCUMENTS

| | | |
|---|---|---|
| 9,454,084 B2 | 9/2016 | Lyulina et al. |
| 10,859,924 B2 | 12/2020 | Wang et al. |
| 2018/0329312 A1 | 11/2018 | Kuiper et al. |
| 2019/0179231 A1 | 6/2019 | Laske et al. |
| 2020/0057388 A1 | 2/2020 | Sun et al. |
| 2021/0116389 A1 | 4/2021 | Feng |

OTHER PUBLICATIONS

Kuiper, Stefan, Erik Fritz, Will Crowcombe, Thomas Liebig, Geerten Kramer, Gert Witvoet, Tom Duivenvoorde et al. "Large dynamic range atomic force microscope for overlay improvements." In Metrology, Inspection, and Process Control for Microlithography XXX, vol. 9778, pp. 438-447. SPIE, 2016.

Silver, Richard M., Ravikiran Attota, Michael Stocker, Michael Bishop, Jau-Shi Jay Jun, Egon Marx, Mark P. Davidson, and Robert D. Larrabee. "High-resolution optical overlay metrology." In Metrology, Inspection, and Process Control for Microlithography XVIII, vol. 5375, pp. 78-95. SPIE, 2004.

Wu, Chengzhang, Dongyu Xu, Hua Yuan, Yinsheng Yu, Hongwen Zhao, Wenzhan Zhou, Haifeng Pu et al. "Hybrid overlay control solution with CDSEM and optical metrology." In Metrology, Inspection, and Process Control for Semiconductor Manufacturing XXXV, vol. 11611, pp. 342-349. SPIE, 2021.

Inoue, Osamu, and Kazuhisa Hasumi. "Review of scanning electron microscope-based overlay measurement beyond 3-nm node device." Journal of Micro/Nanolithography, MEMS, and MOEMS 18, No. 2 (2019): 021206.

Liu, Xiaolei, Eitan Hajaj, Alon Volfman, Hedvi Spielberg, Yoav Grauer, Raviv Yohanan, and Xindong Gao. "Improved device overlay by litho aberration tracking with novel target design for DRAM." In Metrology, Inspection, and Process Control for Microlithography XXXIV, vol. 11325, pp. 497-501. SPIE, 2020.

Liu, Yu-Lin, Li-Ting Chang, Chi-Hao Huang, Mars Yang, Elvis Yang, T. H. Yang, and K. C. Chen. "Imaging-based overlay metrology optimized by HV-SEM in 3D-NAND process." In Metrology, Inspection, and Process Control for Semiconductor Manufacturing XXXV, vol. 11611, pp. 659-666. SPIE, 2021.

METHOD AND STRUCTURE FOR DETERMINING AN OVERLAY ERROR

CROSS-REFERENCE TO RELATED APPLICATIONS

The present application is a non-provisional patent application claiming priority to European Patent Application No. 21217706.7, filed Dec. 24, 2021, the contents of which are hereby incorporated by reference.

FIELD OF THE DISCLOSURE

The present disclosure relates to the field of overlay control in the manufacturing of semiconductor devices. In particular, the present disclosure relates to a device comprising an overlay metrology area for evaluating an overlay error, and a method for determining an overlay error.

BACKGROUND

Controlling an overlay between semiconductor device structures, e.g., elements of a semiconductor device, in different layers, by optically detecting a distance between periodic structures in the different layers, located in an overlay metrology area that is separated from the area where the device structures are formed, is well-established in the semiconductor industry. Overlay control facilitates accuracy and reproducibility of stacking of layers in semiconductor processes. Also, optical techniques may be used for overlay control including, for example, electron microscopy. However, optical techniques have the potential benefit of speed and may be easily performed in line, for example, during semiconductor device production. Furthermore, as described in SILVER, Richard M., et al. High-resolution optical overlay metrology. In: Metrology, Inspection, and Process Control for Microlithography XVIII. International Society for Optics and Photonics, 2004. p. 78-95, overlay control by optical techniques is not limited by the Rayleigh limit, corresponding to the wavelength of light used in the optical technique, which is typically hundreds of nanometers. Indeed, in the state of the art, optical overlay control may be performed at a resolution of less than 10 nm.

As an example, U.S. Pat. No. 9,093,458B2 describes a semiconductor structure comprising an overlay metrology area for evaluating an overlay error between a first structure in a first layer and a second structure in a second layer, located in a device area separated from the overlay metrology area. The overlay metrology area comprises a periodic array of structures in the first layer and a periodic array of structures in the second layer. The periodic array of structures in the first layer may overlap with the periodic array of structures in the second layer. The distance between features of the periodic structures may be optically detected. Based on the distance, it may be determined whether the devices located in the different layers located in the device area also have good overlap.

As dimensions of devices become smaller and smaller, requirements for overlay control become more stringent. Thus, there is a need in the art for devices and methods that facilitate good overlay control.

SUMMARY

It is a potential benefit of the present disclosure to provide apparatus and methods for evaluating an overlay error.

It is a potential benefit of the present disclosure that a first structure and a second structure, located in a device area, are accurately represented by a combination of a third structure and a fourth structure, located in an optical overlay metrology area and used for evaluating an overlay error. It is a further potential benefit of the present disclosure that the accurate representation may result in an overlay error measured in the optical overlay metrology area that is representative of an overlay error between structures in the device area.

In a first aspect, the present disclosure relates to a semiconductor structure comprising a first layer and a second layer on top thereof and in physical contact therewith. The semiconductor structure comprises a device area comprising a first structure in the first layer having a top surface above a top surface of the first layer, and a second structure in the second layer in physical contact with the first structure, such that the first structure is pinned in the second structure. The semiconductor structure further comprises an optical overlay metrology area for optically evaluating an overlay error between the second structure and the first structure. The optical overlay metrology area comprises: a third structure in the first layer, formed of a material of which the first structure is formed, and having a top surface above the top surface of the first layer, a fourth structure in the second layer, formed of a material of which the second structure is formed, in physical contact with the third structure, such that the combination of the third and fourth structures mimics the combination of the first structure and the second structure, and a fifth structure in the first layer for use as a reference structure.

The inventors have unexpectedly observed that an overlay error determined using an optical overlay metrology area of the state of the art, for which there is no third structure as in accordance with the present disclosure, and thus wherein the combination of the third and fourth structures mimicking the combination of the first structure and the second structure does not appear, might not correspond to an actual overlay error between the first structure and the second structure. In other words, the determined overlay error unexpectedly appeared to be inaccurate. The inventors have found that relaxation processes in a second layer as a result of the etching of the second layer may result in slight displacement of the second layer with respect to the first layer. The displacement may be different in the device area than in the overlay metrology area. The inventors have found that this difference appeared to be due to differences in interaction between the first layer and the second layer, or correspondingly the first structure and the second structure, in the device area and between the first layer and the second layer in the overlay metrology area. The overlay error may more accurately represent the actual overlay error between the first structure and the second structure in the device area, when an interaction between the first layer and the second layer is mimicked in the overlay metrology area. In an attempt to accurately mimic the interaction, the present disclosure comprises the third structure combined with the fourth structure, for mimicking the combination of the first structure and the second structure.

In examples, the mimicking comprises that the third structure is pinned in the fourth structure, for example the same way the first structure is pinned in the second structure. It is a potential benefit of the present disclosure that the pinning of the first structure in the second structure is mimicked by the third structure being pinned in the fourth structure.

In examples, the first structure is a channel formed of a channel material. In these examples, the third structure may also be formed of the channel material. Furthermore, the fifth structures may be formed of the channel material. In examples, the channel material comprises an n-doped semiconductor material or a p-doped semiconductor material, wherein the semiconductor material is for example silicon.

In examples, the second structure is an electrode formed of an electrically conductive material and the fourth structure is formed of the electrically conductive material. In examples, the second structure and the fourth structure are formed of a metal, for example tungsten. The inaccuracy in the determined overlay error may be particularly pronounced when the second structure is formed of a relatively high tensile strength material, such as tungsten.

In examples, the first structure is the channel and the second structure is the electrode. In examples, the device area comprises a gate structure, formed of a gate material, in the first layer wrapping the channel. In these examples, the optical overlay metrology area comprises a structure formed of the gate material in the first layer wrapping the third structure. In these examples, the optical overlay metrology area comprises a structure formed of the gate material in the first layer wrapping the fifth structure. The gate material may improve mimicking of the device structure, possibly further improving the accuracy of the determination of the overlay error.

In examples, the device area comprises a semiconductor device, such as a field effect transistor, e.g., a vertical field effect transistor. In examples, the first structure and the second structure are part of the semiconductor device, for example of the vertical field effect transistor. The vertical field effect transistor may comprise a further electrode, wherein the vertical field effect transistor is located above and in physical contact with the further electrode. The disclosure is, however, not limited to vertical field effect transistors, and instead, the semiconductor device may be a complementary field effect transistor.

In examples, the third structure comprises an array of elements. In examples, the array is a two-dimensional array, e.g., the array comprises rows and columns of elements. In examples, each row, oriented along a first direction parallel to the top surface of the first layer, comprises at least two elements, and each column, oriented along a second direction parallel to the top surface of the first layer and perpendicular to the first direction, comprises at least two, for example at least five, elements. In examples, each array of the third structure comprises a plurality of elements, e.g., from 2 to 200 elements. In examples, a first pitch between a first element and a last element in a row of the array of elements of the third structure is within a range of 200 nm to 2000 nm, and a second pitch between a first element and a last element in a column of the array of elements of the third structure is within a range of 500 nm to 20 µm. In examples, a ratio of the second pitch to the first pitch is at least two, for example at least five. In examples, a pitch between adjacent elements of the array is within a range of 20 nm to 200 nm. The array of elements of the third structure is for example a periodic array, for example defining a rectangle. The periodicity may, for example, avoid asymmetry effects from any processes. The periodicity may at least mean that the pitch between each pair of adjacent elements within the periodic array is substantially the same. The periodicity may at least mean that a width, parallel to the top surface of the first layer, of each element in the periodic array is substantially the same. The periodicity may at least mean that the elements of the periodic array of the third structure are substantially identical.

In examples, the third structure comprises at least two arrays of elements, for example, at least five arrays of elements. In examples, neighboring arrays are separated from each other by a distance within a range of 200 nm to 4000 nm, for example a range of 500 nm to 1500 nm, for example from 800 nm to 1200 nm. The arrays may form a periodic structure, e.g., the third structure may be a periodic third structure. In examples, the arrays are symmetrically distributed throughout the third structure, e.g., the third structure may be substantially mirror symmetric or centrosymmetric. In examples, a distance between each pair of adjacent arrays of the third structure is substantially the same.

In examples, the fourth structure comprises at least one, for example at least two, for example at least five, elements. In examples, each element of the fourth structure has a width, in a direction parallel to the top surface of the first layer, and a length, in a direction parallel to the top surface of the first layer and perpendicular to the width, that are at least 100 nm, for example at least 200 nm, for example at least 500 nm. In examples, a ratio of the length to the width is at least two, for example at least five. In examples, each element of the fourth structure has a width and a length which is each at least 5 times larger, for example at least 10 times larger, than the respective width and length of an element of the third structure. Herein, the width and length are perpendicular to each other and parallel to a top surface of the first layer. For example, each element of the fourth structure has substantially identical dimensions. In examples, a longest side of adjacent fourth structures is orientated parallel with respect to each other. In examples, the fourth structure is in physical contact with a plurality of elements of the third structure, e.g., with each element of an array of the third structure. In examples wherein the third structure comprises an array of elements, the fourth structure is in physical contact with each element of the third structure. While dimensions of the elements of the third structure may be small so as to mimic interactions between the first structure and the second structure so as to improve the overlay error, at the same time, the size of elements of the fourth structure is for example sufficiently large so as to facilitate optical detection, and for ease of formation. As each element of the fourth structure may, independently from other elements of the fourth structure, be used to determine an overlay error, a greater number of elements in the fourth structures may result in a lower statistical error on a determined overlay error. In examples, each element of the fourth structure is a solid piece of material, for example a cuboid or a rectangular cuboid bar. The disclosure is, however, not limited thereto, and in some examples, each element of the fourth structure comprises subelements, e.g., an array of subelements. For instance, a long bar could be segmented to a plurality of short bars. In examples, each element of the fourth structure comprises one subelement for each element of the third structure overlapped by the element of the fourth structure.

In examples, the elements of the fourth structure are symmetrically distributed throughout the fourth structure, e.g., the fourth structure may be substantially mirror symmetric, or centrosymmetric. In examples, a distance between each pair of adjacent elements of the fourth structure is substantially the same.

In examples, the fifth structure is not limited to a particular form, as it mainly functions as a reference structure. In examples, the fifth structure comprises at least one array of elements. In examples, the array is a two-dimensional array, i.e., comprises rows and columns of elements. In examples, each row, oriented along a first direction parallel to the top surface of the first layer, comprises at least one, for example at least two elements, and each column, oriented along a second direction parallel to the top surface of the first layer and perpendicular to the first direction, comprises at least one, for example at least two, for example at least five, elements. In examples, each array of the fifth structure comprises a single element. However, typically, each array of the fifth structure comprises a plurality of elements, e.g., from 2 to 200 elements. In examples, a first pitch between a first element and a last element in a row of the array of the fifth structure is within a range of 200 nm to 2000 nm, and a second pitch between a first element and a last element in a column of the array of the fifth structure is within a range of 500 nm to 20 μm. In examples, a ratio of the second pitch to the first pitch is at least two, for example at least five. In examples, the first pitch and the second pitch are substantially the same as a width and a length of elements of the fourth structure. In examples, a pitch between adjacent elements of the array of the fifth structure is within a range of 20 nm to 200 nm. The array is for example a periodic array, for example defining a rectangle. It is a potential benefit of these examples that asymmetry effects arising from any processes may be avoided. It is a further potential benefit of these examples that the periodicity may result in a homogeneous and optically observable rectangle. As such, the periodic array may comprise features that may be optically well-defined and may result in a resolution for determining features of the fifth structure, well below the Rayleigh limit, e.g., less than 10 nm. The periodicity may at least mean that the pitch between adjacent elements is substantially the same. The periodicity may at least mean that a width, parallel to the top surface of the first layer of each element in the periodic array is substantially the same. The periodicity may at least mean that the elements of the periodic array are substantially identical.

In examples, the fifth structure comprises at least two, for example at least five, arrays. In examples, neighboring arrays are separated from each other by a distance within a range of 200 nm to 4000 nm, for example from 500 nm to 1500 nm, for example 800 nm to 1200 nm. In examples, a distance between each pair of arrays is substantially the same. In examples, longest edges of neighboring arrays are oriented substantially parallel with respect to each other. It is a potential benefit that features of a first array of the fifth structure may be distinguished from features of a second, neighboring, array of the fifth structure. As each array may, independently from other arrays, be used to determine an overlay error, a greater number of arrays present in the optical overlay metrology area may result in a lower statistical error on a determined overlay error.

In examples, the fifth structure, i.e., elements of the fifth structure, has a top surface above a top surface of the first layer, but this is not required. However, the fifth structure having the top surface above the top surface of the first layer, similar to the third structure having the top surface above the top surface of the first layer, may be a result of the same processing that is applied to the third structure as to the fifth structure. In examples, for each element of the third structure, the fifth structure comprises a corresponding element in an array of elements of the fifth structure. Thereby, a distance between features of one element of the third structure and features of one array of the fifth structure may be determined. The disclosure is, however, not limited thereto.

In examples, the arrays of elements of the fifth structure are symmetrically distributed throughout the fifth structure, e.g., the fifth structure may be substantially mirror symmetric, or centrosymmetric. In examples, a distance between each pair of adjacent elements of the fifth structure is substantially the same.

In examples, arrays and elements of the fifth structure are sufficiently separated from arrays and elements of the fourth structure such that features of the fifth structure and features of the fourth structure may be easily distinguished from each other. In examples, a gap between elements of the fifth structure and elements of the fourth structure is at least 100 nm, for example at least 200 nm, for example at least 400 nm.

In examples, the first structure has a top surface having an aspect ratio ranging from 1 to 5, for example from 1 to 2. In examples, each element of the third structure, and possibly each element of the fifth structure, has an aspect ratio ranging from 1 to 5, for example from 1 to 2. In examples, the first structure has a total vertical extent measured perpendicularly to the top surface of the first layer which is at least twice larger than the largest lateral extent of the first structure. In examples, the elements of the third structure, and possibly the elements of the fifth structure, have a total vertical extent measured perpendicularly to the top surface of the first layer which is at least twice larger than the largest lateral extent of the third and fifth structure, respectively. In examples, the first structure has a width, parallel to a top surface of the first layer that is at most 100 nm, for example at most 50 nm. In these examples, the elements of the third structure, and possibly the elements of the fifth structure, have a width, parallel to a top surface of the first layer, that is at most 100 nm, for example at most 50 nm. In examples, an area of a top surface of each element of the third structure, measured in a plane parallel to a top surface of the first layer, is within 100%, for example within 20%, of an area of a top surface of the first structure, measured in a plane parallel to the top surface of the first layer. In some examples, an area of a top surface of each element of the fifth structure, measured in a plane parallel to a top surface of the first layer, is within 100%, for example within 20%, of an area of a top surface of the first structure, measured in a plane parallel to the top surface of the first layer. In examples, the first structure is a nanowire. In these examples, the elements of the third structure are nanowires. In examples where the first structure is a nanowire, the elements of the fifth structure are nanowires. In different examples, the first structure is a nanosheet. In these examples, the elements of the third structure are nanosheets. In examples wherein the first structure is a nanosheet, the elements of the fifth structure may be nanosheets.

In still different examples, each array of the fifth structure is a solid piece of material, for example a cuboid or a rectangular cuboid bar, which corresponds to each element of the fifth structure being a solid piece of material, for example a cuboid or a rectangular cuboid bar. In these examples, each element of the fifth structure has a width, in a direction parallel to the top surface of the first layer, and a length, in a direction parallel to the top surface of the first layer and perpendicular to the width, that are at least 100 nm, for example at least 200 nm, for example at least 500 nm.

In examples, the semiconductor structure comprises, in the optical overlay metrology area, in the second layer, a sixth structure for use as a further reference, unpinned by any structure in the first layer. The sixth structure may be formed of the same material as the second structure. The sixth structure may be used to determine an overlay error for unpinned structures in the device area, when present, so that an appropriate correction may be applied for such unpinned structures.

Any features of any example of the first aspect may be included in any example of the second aspect of the present disclosure.

In a second aspect, the present disclosure relates to a method for determining an overlay error between a first structure and a second structure in a semiconductor structure. The method comprises a step of: i) obtaining an intermediate structure to the formation of the semiconductor structure, comprising a first layer, a second layer on top of the first layer, and a masking layer over the second layer. The intermediate structure comprises: 1) a device area comprising: a) the first structure in the first layer, having a top surface above a top surface of the first layer, b) the second layer, formed of a material of the second structure, in physical contact with the first structure, such that the first structure is pinned in the second layer, and c) a first masking structure in the masking layer, overlapping with the first structure, and 2) an optical overlay metrology area comprising: a) a third structure in the first layer, having a top surface above the top surface of the first layer, b) the second layer, typically formed of a material of which the second structure is formed, in physical contact with the third structure, such that the third structure is pinned in the second layer, c) a second masking structure in the masking layer, overlapping with the third structure, and d) a fifth structure in the first layer. The method further comprises a step of: ii) optically detecting a first distance between a feature of the second masking structure and a feature of the fifth structure. The method further comprises a step of: iii) etching the second layer, by using the first masking structure and the second masking structure as a mask, so as to form the second structure, in physical contact with the first structure, and a fourth structure, in physical contact with the third structure. The method further comprises a step of: iv) optically detecting a second distance between a feature of the fourth structure, corresponding to the feature of the second masking structure, and the feature of the fifth structure. The method further comprises a step of: v) comparing the first distance with the second distance.

It is a potential benefit of examples of the present disclosure that an overlay error determined between the first structure and the second structure is based on a third structure and a fourth structure in the overlay metrology area that, in combination, accurately mimic the combination of the first structure and the second structure in the device area. As such, the present disclosure may provide information on the shift between the location of the first masking structure, that is for forming the second structure, and the second structure subsequently formed therewith. The overlay error may be used to correct the location at which a further masking layer is formed in a further semiconductor structure, such that, in subsequent runs for forming the further semiconductor structures, corresponding further second structures are formed at the correct location over, i.e., correctly overlaying, the corresponding first structures in the further semiconductor structure. The correction to the location of the mask may be applied locally, e.g., a further masking layer for forming the further second structure in the further semiconductor structure may be relocated compared to the corresponding location of the masking for forming the semiconductor structure, in accordance with the overlay error that is determined. This may, however, require redesign of a mask pattern used for forming the masking layer, e.g., by redesigning the lithographic mask used for forming the masking layer (e.g., when the masking layer is formed of a photoresist material so that the pattern of the mask pattern may be transferred into the masking layer by (E)UV radiation), which may be time-consuming and expensive. Typically, therefore, the correction is applied by shifting the complete mask pattern used for forming the masking layer, e.g., by moving the lithographic mask as a whole, such that further corresponding masking layers in further semiconducting structures result in good overlap between the corresponding further first structure and the corresponding further second structure. As such, the overlay error measurement of the present disclosure may be used for a correction to the transfer of the pattern from the mask pattern to the masking layer for better alignment.

As the overlay error depends on several processing parameters and may furthermore depend on a location on a wafer in which the semiconductor structure is formed, examples of the method of the present disclosure may be applied for each process, possibly at multiple locations scattered over the wafer.

In examples, the masking layer may be formed of a photoresist. In examples, a mask pattern is used to form a pattern, comprising at least the first masking structure and the second masking structure in the masking layer. For example, a pattern in the mask pattern may be transferred into the masking layer by illumination, for example by UV or EUV irradiation. Either a positive photoresist or a negative photoresist may be used.

Lateral dimensions of the first structure, the second structure, and/or the third structure in the masking layer typically correspond to lateral dimensions of the second structure, the fourth structure, and/or the sixth structure formed therewith after the etching, respectively.

In examples, obtaining the intermediate structure comprises: obtaining the first layer comprising the third structure, having a top surface coplanar with the top surface of the first layer; epitaxially growing material, of which the third structure is formed, on the top surface of the third structure, thereby bringing its top surface above the top surface of the first layer; and depositing the second layer on the first layer.

In examples, the second layer of the intermediate structure in the construction of the semiconductor structure has a thickness of at most 60 nm, for example at most 30 nm. This is particularly relevant in examples where the fifth structure is comprised in the first layer and is formed of a channel material. In those examples, the first distance may be determined based on optical detection of a feature of the fifth structure through the second layer. It is therefore possible that absorption of light by the second layer is limited, which may be the case when the second layer is thin.

In examples, the optically detecting may be performed by optically detecting the semiconductor structure from above. Illumination may be performed from above, e.g., in backscattering configuration, but this is not required. Although this may, in principle, be performed with any optical detector for detecting sufficiently small features in the semiconductor structure, commercial optical detectors are available, such as a commercial optical inspection machine (KLA-700) for overlay measurement. The characteristics typically used to optimize detection (signal to noise ratio) are wavelength and illumination modes. In examples, the wavelength of the light used for the detection may range from 50 nm to 2000 nm, for example from 150 nm to 1000 nm, for example from 350 nm to 1000 nm.

In examples, optically detecting the first distance and the second distance comprises optically detecting lateral distances, i.e., distances in a direction in a plane parallel to a top surface of the first layer. In examples, the first distance is determined between features of the second masking structure and features of the fifth structure. In examples, the features may be a centroid or an edge of individual elements or arrays, although the disclosure is not limited to any type of features. As an example, a (masking or other) structure may comprise five bar patterns with a fixed spacing in between. A measurement tool may first be programmed to detect the edge of each bar of the structure. The center line of each bar may be determined by their edge positions. The center of the gravity of the structure can then be obtained from the center lines.

Typically, the used features of the second masking structure correspond to the used features of the fifth structure, e.g. a distance is measured between the centroid of the second masking structure and the centroid of the fifth structure. The second distance is determined based on corresponding features in the fourth structure and the second masking structure. This means that in detecting the first distance, for example, a centroid of the second masking structure can be used, for measuring the second distance, correspondingly, a centroid of the fourth structure can be used.

In examples, etching the second layer comprises performing an etching technique that selectively etches the second layer with respect to the masking layer. In examples, the etching comprises performing a liquid etch, e.g., using a hydroxide or $H_2O_2$, although the etching technique is not limited thereto. In alternative examples, dry etching, such as reactive ion etching (RIE), may be used. ME can produce very anisotropic etch profiles, in contrast to the typically isotropic profiles of wet etching, which is potentially beneficial for producing structures with very fine dimensions.

In examples, obtaining the intermediate structure comprises obtaining, in the masking layer, a third masking structure, not overlapping with any structure for pinning in the first layer, further comprising a step of optically detecting a third distance between a feature of the third masking structure and a feature of the fifth structure or a feature of the second masking structure. The etching of the second layer then also comprises using the third masking structure as a mask so as to form a sixth structure in the second layer, unpinned by any structure in the first layer. The method further comprises optically detecting a fourth distance between the fourth structure or the fifth structure, and the sixth structure. The third distance is then compared to the fourth distance so as to determine a lateral shift of the sixth structure in the second layer, unpinned by the underlying first layer. This may provide information on lateral shifts of unpinned structure in the device area with respect to the mask structure with which they are formed. In these examples, the method may further comprise determining an overlay error for unpinned structures in the first layer and the second layer based on the comparison between the third distance and the fourth distance. Furthermore, the method may comprise determining the lateral shift attributed to the stress release in the second layer from the comparison of the third distance and the fourth distance and the comparison of the first distance and the second distance. Similar to the overlay error between the first structure and the second structure, the overlay error for unpinned structure may be compensated for. If both types of overlay error are to be compensated for at the same time, a redesign of the mask pattern may be required.

Typically, the first distance and the second distance are determined in a common lateral direction. By comparing the first distance with the second distance, it may be derived how much the fourth structure is shifted with respect to the second masking structure used for forming the fourth structure. In examples, the method further comprises determining an overlay error for pinned structures in the first layer and the second layer based on the comparison between the first distance and the second distance. This may, for example, be determined by calculating the difference between the first distance and the second distance, e.g., by subtracting the second distance from the first distance. This result may correspond with a lateral shift of the fourth structure with respect to the second masking structure, and is typically the same as the lateral shift of the second structure with respect to the first masking structure. In examples, the method further comprises applying the overlay error for pinned structures to reposition a mask pattern used for forming the masking layer. As mentioned above, for example, the complete mask pattern is repositioned, e.g., shifted by an amount equal to the difference between the first distance and the second distance, in the same direction as the first distance and the second distance were determined. The above described method may be repeated for different, for instance, perpendicular lateral directions as defined by the array of structures.

Any features of any example of the second aspect may be included in any example of the first aspect of the present disclosure.

Aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features, and potential benefits of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

BRIEF DESCRIPTION OF THE FIGURES

The above, as well as additional, features will be better understood through the following illustrative and non-limiting detailed description of example embodiments, with reference to the appended drawings.

Figure 1:
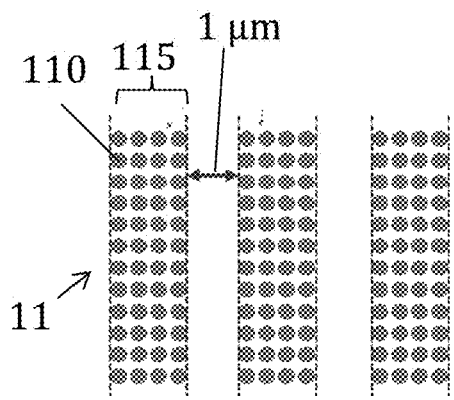
FIG. 1 is a top-view schematic representation of a fifth structure in accordance with an example.

In the different figures, the same reference signs refer to the same or analogous elements.

All the figures are schematic, not necessarily to scale, and generally only show parts which are necessary to elucidate example examples, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

Similarly, it is to be noticed that the term "pinned," can mean that features have direct connections by protruding parts and recesses fitting into one another. The pinning can be a more intimate connection than a simple physical contact of two adjacent structures or layers. Recesses in a particular structure do not have to be provided as such, but can be formed for instance by depositing the particular structure over an earlier formed structure having pinning features sticking out.

The disclosure will now be described by a detailed description of several examples of the disclosure. It is clear that other examples of the disclosure can be configured according to the knowledge of persons skilled in the art without departing from the true spirit or technical teaching of the disclosure, the disclosure being limited only by the terms of the appended claims.

Experimental Observation of Inaccurate Overlay Error

When a conventional overlay control method was performed, the inventors observed inaccuracies in the overlay error between the overlay error measured in an optical overlay metrology area and measured for a real device. The overlay control method was performed as follows. A first reference structure was formed in an optical overlay metrology area in a first layer. Furthermore, a channel structure was formed in a device area in the first layer. A second layer formed of tungsten was formed on the first layer, in physical contact with the fifth structure and the channel structure. A masking layer was formed over the second layer, comprising a first masking structure overlapping the channel structure in the device area, and comprising a second masking structure in the optical overlay metrology area, such that there is no overlap between the second masking structure and the third structure. A first lateral distance was optically detected between features of the second masking structure and features of the first reference structure.

Subsequently, the second layer was patterned using an etching technique, so as to transfer the pattern of the first masking structure and the second masking structure into the second layer. As a result, an electrode was formed on the channel structure, thereby forming a device in the device area comprising the electrode and the channel structure. Furthermore, a second reference structure was formed in the second layer and in physical contact with the first layer. Subsequently, a second distance was optically detected between features of the second reference structure, corresponding to the features of the second masking structure, and the features of the first reference structure. The first distance and the second distance were compared so as to determine an overlay error. From the optical measurements in the overlay metrology area, it was concluded that the overlay error was very large. However, from SEM measurements performed on the device, the actual overlay error appeared to be very small for the device. This is in stark contrast with the overlay error derived from the overlay metrology area, indicating that conventional overlay control may not be accurate.

In a first aspect, the present disclosure relates to a semiconductor structure comprising a first layer and a second layer on top thereof and in physical contact therewith. The semiconductor structure comprises a device area comprising a first structure in the first layer having a top surface above a top surface of the first layer, and a second structure in the second layer in physical contact with the first structure, such that the first structure is pinned in the second structure. The semiconductor structure further comprises an optical overlay metrology area for optically evaluating an overlay error between the second structure and the first structure. The optical overlay metrology area comprises: a third structure in the first layer, formed of a material of which the first structure is formed, and having a top surface above the top surface of the first layer, a fourth structure in the second layer, formed of a material of which the second structure is formed, in physical contact with the third structure, such that the combination of the third structure and the fourth structure mimics the combination of the first structure and the second structure, and a fifth structure in the first layer for use as a reference structure.

In a second aspect, the present disclosure relates to a method for determining an overlay error between a first structure and a second structure in a semiconductor structure. The method comprises a step of: i) obtaining an intermediate structure to the formation of the semiconductor structure, comprising a first layer, a second layer on top of the first layer, and a masking layer over the second layer. The intermediate structure comprises: 1) a device area comprising: a) the first structure in the first layer, having a top surface above a top surface of the first layer, b) the second layer, formed of a material of the second structure, in physical contact with the first structure, such that the first structure is pinned in the second layer, and c) a first masking structure in the masking layer, overlapping with the first structure, and 2) an optical overlay metrology area comprising: a) a third structure in the first layer, having a top surface above the top surface of the first layer, b) the second layer, typically formed of a material of which the second structure is formed, in physical contact with the third structure, such that the third structure is pinned in the second layer, c) a second masking structure in the masking layer, overlapping with the third structure, and d) a fifth structure in the first layer. The method further comprises a step of: ii) optically detecting a first distance between a feature of the second masking structure and a feature of the fifth structure. The method further comprises a step of: iii) etching the second layer, by using the first masking structure and the second masking structure as a mask, so as to form the second structure, in physical contact with the first structure, and a fourth structure, in physical contact with the third structure. The method further comprises a step of: iv) optically detecting a second distance between a feature of the fourth structure, corresponding to the feature of the second masking structure, and the feature of the fifth structure. The method further comprises a step of: v) comparing the first distance with the second distance.

Figure 2:
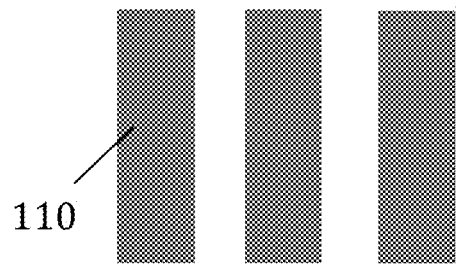
FIG. 2 is a top-view schematic representation of a fifth structure in accordance with an example, detected with optical tools having a resolution larger than the width of elements of the fifth structure.

Example 1: Semiconductor Structure for Determining an Overlay Error Between an Electrode and a Channel Structure Reference is made to FIG. 1, which is a top view of a fifth structure 11, comprising three two-dimensional arrays 115 of elements 110, wherein each element 110 is a nanowire. Each row of each array 115 comprises four elements 110, i.e., nanowires, and each column of each array 115 comprises twelve elements. In this example, the nanowires have a diameter of 20 nm, and a pitch between neighboring nanowires is 50 nm. A distance between adjacent arrays 115 is, in this example, 1 µm. When using optical tools to observe the three two-dimensional arrays 115 of the fifth structure 11, for example, using light having a wavelength of 400 nm, individual elements 110 may not be resolvable, but neighboring arrays 115 may be distinguished from each other. A third structure in accordance with examples of the present disclosure may have similar features as the fifth structure 11. As such, in this example, each array 115 is observable as a rectangle, as shown in FIG. 2, which is a schematic optical observation of the top of the arrays 115 in FIG. 1.

Figure 3:
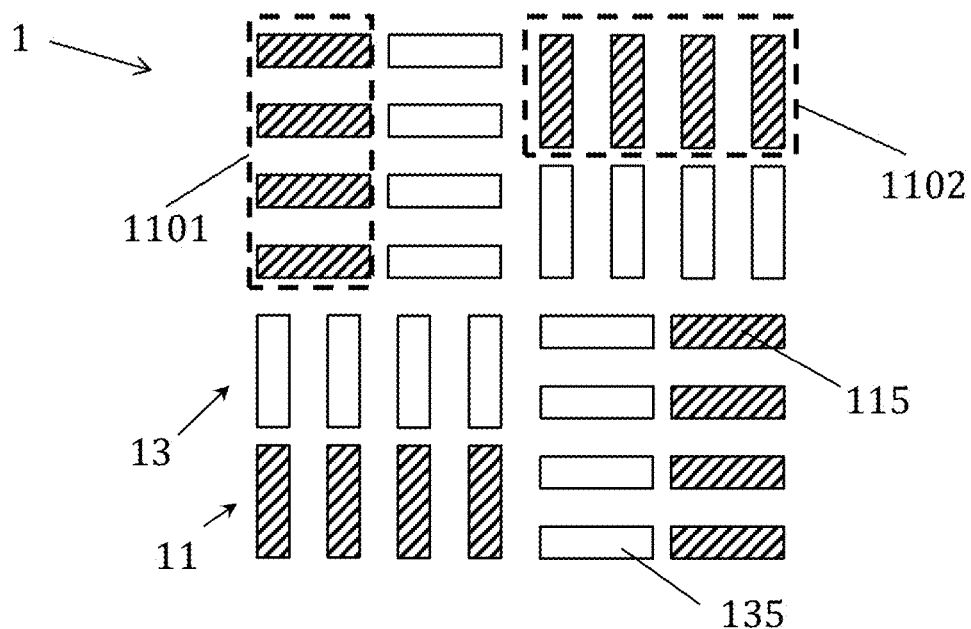
FIG. 3 is a top-view schematic representation of an overlay metrology area of a semiconductor structure in accordance with an example.

Reference is made to FIG. 3, which is a top-view schematic representation of an overlay metrology area 1 of a semiconductor structure. A fifth structure 11 comprises four times four two-dimensional arrays 115 of elements, similar to that shown in FIG. 1 and FIG. 2, in a first layer. The overlay metrology area 1 further comprises a fourth structure 13, comprising four times four elements 135. Each element 135 of the fourth structure 13 has a size enabling accurate optical detection.

In this example, the overlay metrology area 1 comprises a first group 1101 of identical, parallel, and equally spaced two-dimensional arrays 115 of the fifth structure, of which a longest side is perpendicular to a longest side of arrays 115 of the fifth structure of a second group 1102 of identical, parallel, and equally spaced two-dimensional arrays 115 of the fifth structure. It is a potential benefit of this configuration that an overlay error may be accurately determined in both directions. The present disclosure is, however, not limited to this configuration and very different configurations may also be used in accordance with examples of the present disclosure.

In this example, the overlay metrology area 1 further comprises one corresponding element 135 of the fourth structure 13 for each array 115 of the fifth structure 11, having dimensions identical to the rectangle formed by the arrays 115. In this example, the corresponding element 135 of the fourth structure 13 and the array 115 of the fifth structure 11 are separated from each other by a distance that is at least 200 nm, for example at least 4000 nm, so that features of the fourth structure 13, e.g., of the elements 135 (or possibly even subelements) thereof, may be easily distinguished from features of the fifth structure 11, e.g., of the arrays 115 or elements thereof. In this example, each corresponding element 135 of the fourth structure 13 and the array 115 of the fifth structures 11 are oriented such that longest sides are parallel with respect to each other. Furthermore, the corresponding element 135 of the fourth structure 13 and the array 115 of the fifth structure 11 are in line with each other, which may facilitate accurately determining a distance, e.g., a second distance, between features, e.g., centroids, of the corresponding structures. As many such corresponding elements 135 and arrays 115 are present in the overlay metrology area 1, a statistical error on the distance may be limited.

Figure 4:
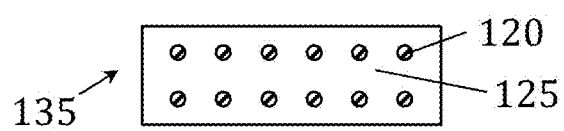
FIG. 4 is a top-view schematic representation of a single element of the fourth structure, overlaying an array of elements of a third structure, in accordance with an example.

Reference is made to FIG. 4, which is a top-view schematic representation of a single element 135 of the fourth structure 13, and an array 125 of elements 120 of a fifth structure 11, located in the first layer in physical contact with, and pinning, the single element 135 of the fourth structure 13. In this example, the single element 135 of the fourth structure 13 completely overlaps each of the periodically arranged identical elements 120 of the third structure. In this example, each element 120 of the third structure is a nanowire. The nanowire is orientated vertically. As such, a total vertical extent measured perpendicularly to the top surface of the first layer is at least twice larger than the largest lateral extent, i.e., parallel to the top surface, of each element 120. A length and width, perpendicular to each other and parallel to a top surface of the first layer, of each element 120 of the fifth structure is small, e.g., at least five times as small, compared to a length and width, respectively, of the single element 135 of the fourth structure 13. In this example, each element 120 of the third structure has a top surface having an aspect ratio of 1. Indeed, the length and width of each element 120 of the third structure is similar to that of a channel structure in a device area (not shown), typically at most 100 nm, so that the combination of the elements 120 of the third structure and the single element 135 of the fourth structure accurately mimics the interaction between the first structure and the second structure of the real device.

Example 2: Method for Determining an Overlay Error Between an Electrode and a Channel Structure This is an example of a method for determining an overlay error between a structure 22 (e.g. an electrode) and a structure 21 (e.g., a channel structure) of a semiconductor structure in accordance with examples of the present disclosure.

Figure 5:
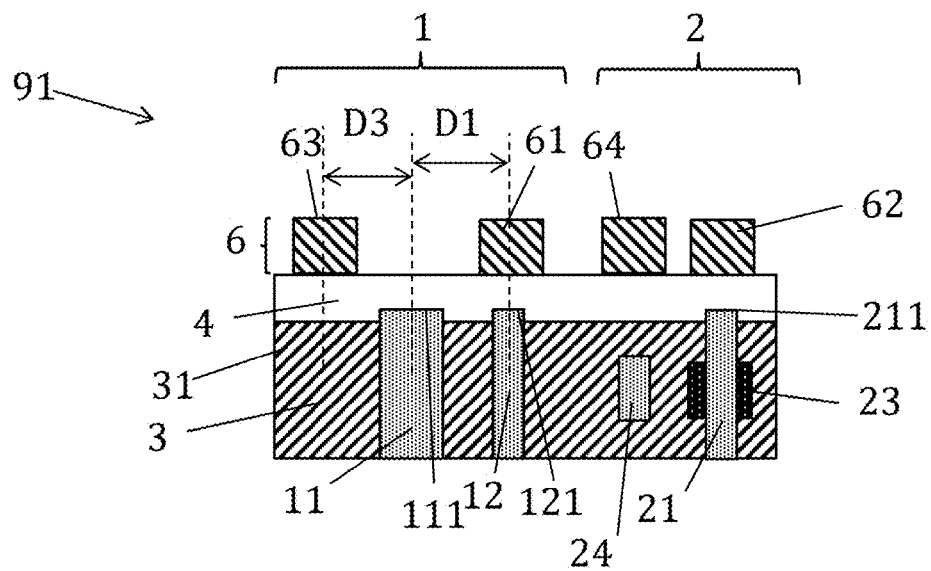
FIG. 5 is a schematic vertical cross-section of an intermediate in the construction of a semiconductor structure for use in a method in accordance with an example.

Reference is made to FIG. 5, which is a schematic vertical cross-section of an intermediate structure 91 in the construction of the semiconductor structure. The intermediate structure 91 comprises an overlay metrology area 1 and a device area 2, that do not laterally overlap with each other. The device area 2 comprises an intermediate in the formation of a device that is, in this example, a vertical field effect transistor, comprising in a first layer 3 a first structure 21 (e.g., a channel structure) and a gate structure 23 wrapped around the first structure 21. A top surface 211 of the first structure 21 is located above a top surface 31 of the first layer 3. As such, a portion of the first structure 21 protrudes into a second layer 4 on top of the first layer 3, thereby pinning the first structure 21 into the second layer 4. The device area 2 further comprises a first masking structure 62 of a mask layer 6 for forming a second structure 22, corresponding, in this example, to an electrode, in the second layer 4, which is formed of an electrically conducting material. The mask layer 6 was patterned by the use of a lithographic mask.

The overlay metrology area 1 comprises a fifth structure 11 and a third structure 12, both located in the first layer 3. The overlay metrology area 1 is for determining an overlay error between the first structure 21, e.g., the channel structure, and a second structure 22, e.g. an electrode, formed after patterning of the second layer 4. Furthermore, the overlay metrology area 1 comprises a second masking structure 61 of the mask layer 6 for forming a fourth structure 13 in the second layer 4. In this example, the second masking structure 61 overlaps with the third structure 12, so that the fourth structure 13 that is to be formed in the second layer 4 is in physical contact with the third structure 12. In this example, both the top surface 111 of the fifth structure 11 and the top surface 121 of the third structure 12 extend above the top surface 31 of the first layer 3, thereby pinning the second layer 4. This is particularly relevant for the third structure 12, as, in this way, an interaction between the third structure 12 and either the second layer 4, before the patterning, or the fourth structure 13, formed by the patterning, is similar to that between the first structure 21 and either the second layer 4, before the patterning, or the second structure, formed by the patterning, respectively. In other words, the second layer 4 is pinned also to the third structure 12.

In the intermediate structure 91 shown in FIG. 5, a first distance D1 is optically determined between features of the fifth structure 11 and features of the second masking structure 61. The features may, for example, be edges of (arrays or elements of) the fifth structure 11 and the elements of the second masking structure 61, or (such as in this example) a centroid of the top surfaces of the fifth structure 11 and the second masking structure 61, although the disclosure is not limited thereto. The features that are used in the method may depend on the optical tool that is used for the optical determination, but is typically a centroid for ease of optical resolving.

In the example illustrated, the masking layer 6 further comprises a third masking structure 63 in the overlay metrology area 1, for forming a sixth structure 81 in the second layer 4 unpinned to the first layer 3, and a fourth masking structure 64 in the device area 2, for forming a further unpinned structure 82 in the first layer 3 in the device area 2. A third distance D3 may be determined between a feature of the third masking structure 63 and a feature of the fifth structure 11.

Figure 6:
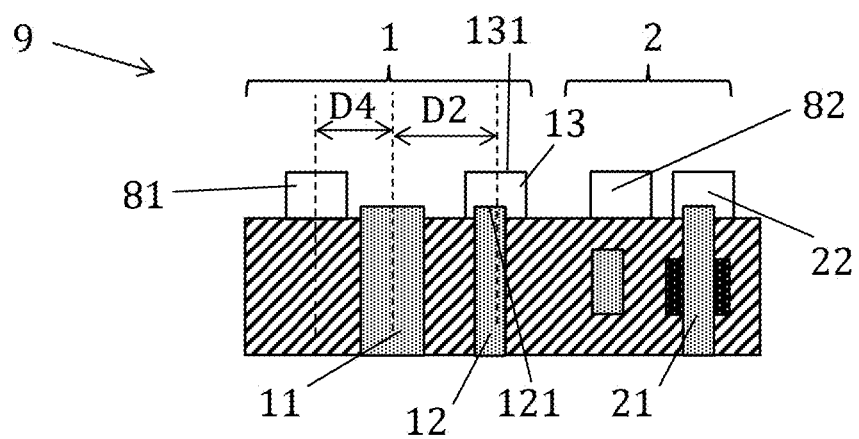
FIG. 6 is a schematic vertical cross-section of a semiconductor structure in accordance with an example.

After determining the first distance D1, and/or the third distance D3, the second layer 4 is etched, using the mask layer 6 as a mask, thereby forming the semiconductor structure 9 of FIG. 6. As a result of the etching, stress and subsequent relaxation of the second layer 4 may occur, thereby possibly locally (or globally) inducing a lateral displacement of (parts of) the second layer 4 with respect to the first layer 3 during the etching. Due to local interactions in the device area 2 being mimicked in the overlay metrology area 1, the overlay error determined in the overlay metrology area 1 may be assumed to be the same as in the device area 2.

As such, the pattern of the mask layer 6 is transferred into the second layer 4. As a result, in the device area 2, a second structure 22, i.e., an electrode, is formed in physical contact with, and pinned by, the first structure 21, thereby forming the device (a further electrode, comprised in the device and located below and in physical contact with the first structure 21, is not shown in this example). A projection of a top surface of the first structure 21 on a bottom surface of the second structure 22 is, in this example, comprised in the bottom surface. Furthermore, in the overlay metrology area 1, a fourth structure 13 is formed in physical contact with, and pinned by, the third structure 12. In this example, a projection of a top surface 121 of the third structure 12 on a bottom surface 131 of the fourth structure 13 is comprised in the bottom surface 131 of the fourth structure 13.

Next, a second distance D2 is determined between the features of the fifth structure 11 (that are the same features of the fifth structure 11 used for determining the first distance D1) and features of the fourth structure 13. The features of the fourth structure 13 correspond to the features of the second masking structure 61 used for determining the first distance D1. This may be understood to mean, for example, that when a centroid of a top surface of the second masking structure 61 was used in determining the first distance D1, a centroid of a top surface of the fourth structure 13 is used in determining the second distance D2. As another example, when a left edge of the second masking structure 61 was used in determining the first distance D1, a left edge of the fourth structure 13 is used in determining the second distance D2.

Subsequently, the second distance D2 is compared to the first distance D1 so as to determine a process induced overlay error between the first structure 21 and the second structure 22. Due to the similar interactions between the third structure 12 and the fourth structure 13 described above in the overlay metrology area 1 and in the device area 2, the determined overlay error may be assumed to accurately represent an overlay error for the device formed in the device area 2. In this example, on comparison, D2 appears to be larger than D1, implying that the second structure 22 and the fourth structure 13 are slightly shifted to the right compared to the first masking structure 62 and the second masking structure 61.

Furthermore, during the etching, a sixth structure 81 in the overlay metrology area 1 and a further unpinned structure 82 in the device area 2 are formed. Overlay between the further unpinned structure 82 and the unpinned structure 24 is clearly not good. In order to solve this, a fourth distance D4 may be measured between the feature of the fifth structure 11 and a feature of the sixth structure 81 corresponding to the feature of the third masking structure 63 used for measuring the third distance D3. Similar to the first distance D1 and second distance D2, an overlay error between the further unpinned structure 82 and an unpinned structure 24 in the first layer 3 may be determined based on the comparison between the third distance D3 and the fourth distance D4.

Although in this example, distances are compared directly with respect to the same fifth structure 11, it is clear to the skilled person that more indirect measurements, e.g., by comparing with different reference structures, could be performed. For example, in a first mark, the first distance D1 and second distance D2 could be determined, and in a second mark, the third distance D3 and the fourth distance D4 could be determined, or the distances could be derived indirectly from different marks, via the use of references structures.

Figure 7:
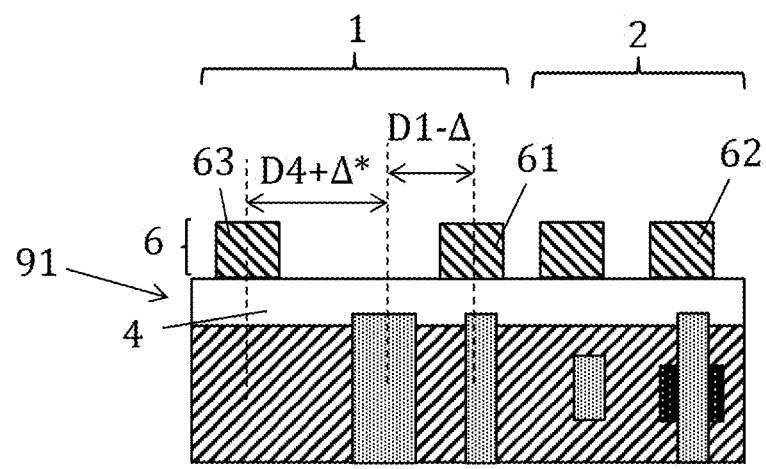
FIG. 7 is a schematic vertical cross-section of an intermediate in the construction of a semiconductor structure to which overlay error correction has been applied, according to an example.
Figure 8:
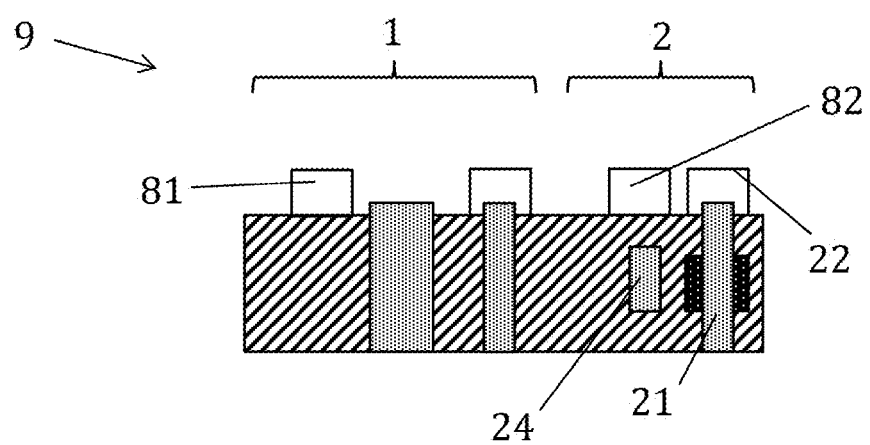
FIG. 8 is a schematic vertical cross-section of a semiconductor structure to which overlay error correction has been applied, according to an example.

Finally, when only compensating for the overlay error between the first structure 21 and the second structure 22, the lithographic mask used for forming the masking layer may be shifted. As a result, a subsequent formation of a further semiconductor structure includes a further corresponding first masking structure 62 and a further corresponding second masking structure slightly to the left, by a distance equal to $\Delta=D2-D1$, which results in the intermediate structure 91 to the semiconductor structure of FIG. 7. This may be performed by shifting the mask pattern used for patterning of the masking layer 6. After processing of the intermediate structure 91, i.e., by transferring the pattern from the masking layer 6 into the second layer 4, this may result in an accurate overlay of the second structure 22 and the first structure 21.

If, as in this example, this overlay error between the first structure 21 and the second structure 22 has to be compensated for at the same time as for the overlay error between the further unpinned structure 82 and the unpinned structure 24 in the first layer 3, in addition or alternatively to the shift of the lithographic mask, a redesign of the lithographic mask may be required. In this example, the lateral shift between the third masking structure 63 and the (e.g., unpinned) sixth structure 81 is equal to $\Delta^*=D3-D4$ to the right. As the sixth structure 81 is unpinned, it may be expected that $\Delta^* \gg \Delta$. When the third masking structure 63 and the fourth masking structure 64 are moved a corresponding distance $\Delta^*$ to the left, the overlay between the further unpinned structure 82 and the unpinned structure 24 may be good.

Figure 9:
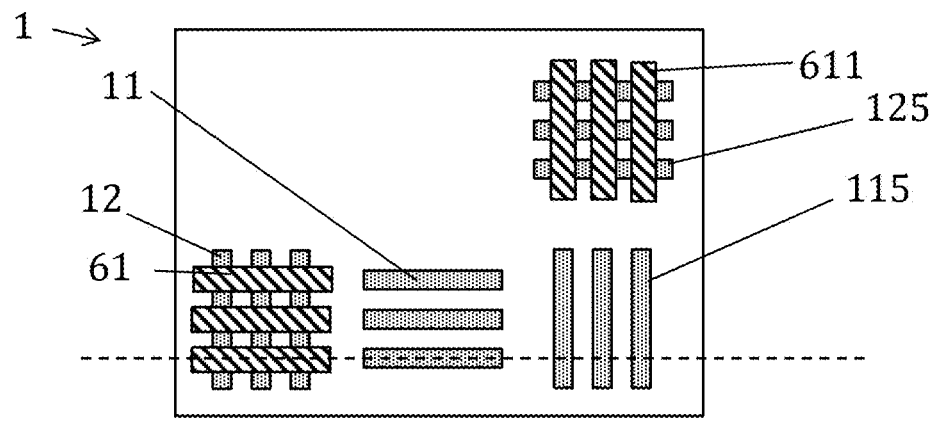
FIG. 9 is a schematic top view of an overlay metrology area of an intermediate in the formation of a semiconductor structure, which may be used in a method in accordance with an example.
Figure 10:
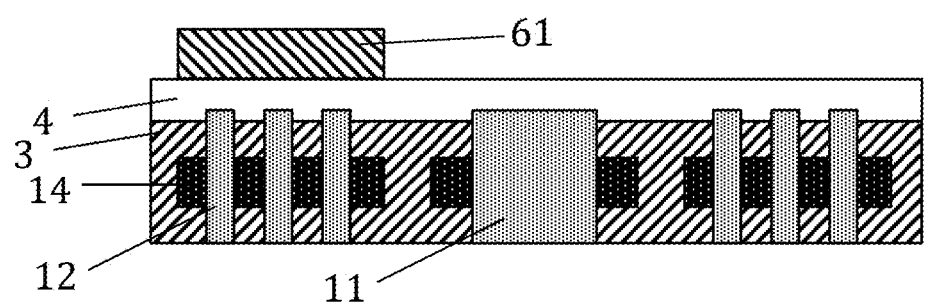
FIG. 10 is a schematic vertical cross-section of an overlay metrology area of an intermediate in the formation of a semiconductor structure, which may be used in a method in accordance with an example.

Example 3: Intermediate Semiconductor Structure for Use in a Method for Determining an Overlay Error Between an Electrode and a Channel Structure Reference is made to FIG. 9, which shows a top view of an overlay metrology area of an intermediate in the formation of a semiconductor structure, which may be used in a method in accordance with examples of the present disclosure. Simultaneous reference is made to FIG. 10, which is a vertical cross-section of the intermediate shown in FIG. 9, along the dashed line in FIG. 9. In this example, the second layer 4 has a thickness less than 60 nm, so that the fifth structure 11 and the third structure 12, both present in the first layer 3, are visible through the second layer 4.

In this example, the fifth structure 11 comprises an array 115 of elements that are (rectangular) sheets. In this example, a second masking structure 61 comprises rectangular elements 611. In this example, the third structure 12 comprises periodically arranged arrays 125 of nanosheets (not shown/unresolved). In this example, the fifth structure 11 and the third structure 12 both have an upper surface located above an upper surface of the first layer 3. In this example, each element of the second masking structure 61 overlaps three arrays of the third structure 12, and each array of the third structure 12 overlaps three elements of the second masking structure 61. The fifth structure 11 does not overlap with the third structure 12 or with the second masking structure 61.

In this example, the overlay metrology area comprises a structure 14 made of a gate material in the first layer 3, wrapping around the elements of the fifth structure 11 and the (elements of the) third structure 12. The gate material may improve mimicking of a device structure (not shown) that may also have a gate structure wrapping around its channel structure. A good mimicking may improve the accuracy of an overlay error.

In the present example, the second layer 4 may be etched so as to transfer the pattern of the second masking structure 61 into the second layer 4, thereby forming a fourth structure 13 in physical contact with the third structure 12. As the pattern of the fourth structure is the same as that of the second masking structure 61, similarly, also a vertical projection of a top surface of the third structure 12 on a bottom surface of the fourth structure 13 is only partially comprised in the fourth structure.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A semiconductor structure comprising:
    a first layer;
    a second layer on top of and in contact with the first layer;
    a device area comprising:
        a first structure in the first layer having a top surface above a top surface of the first layer; and
        a second structure formed of the second layer in contact with the first structure, such that the first structure is pinned in the second structure; and
    an overlay metrology area comprising:
        a third structure in the first layer formed of a material of which the first structure is formed and having a top surface above the top surface of the first layer;
        a fourth structure formed of the second layer in contact with the third structure, such that the combination of the third structure and the fourth structure mimics the combination of the first structure and the second structure; and
        a fifth structure in the first layer having a top surface above the top surface of the first layer.

2. The semiconductor structure according to claim 1, wherein the third structure is pinned in the fourth structure.

3. The semiconductor structure according to claim 1, wherein the first structure comprises a channel formed of a channel material, and wherein the second structure comprises an electrode formed of an electrically conductive material.

4. The semiconductor structure according to claim 3, wherein the second structure and the fourth structure are formed of a metal.

5. The semiconductor structure according to claim 4, wherein the metal is tungsten.

6. The semiconductor structure according to claim 3, wherein the device area comprises a gate structure formed of a gate material in the first layer wrapping the channel, and wherein the overlay metrology area comprises a structure formed of the gate material in the first layer wrapping the third structure.

7. The semiconductor structure according to claim 3, wherein the first structure and the second structure are part of a vertical field effect transistor.

8. The semiconductor structure according to claim 1, wherein the first structure and the third structure comprise nanowires.

9. The semiconductor structure according to claim 1, wherein the first structure and the third structure comprise arrays of nanowires.

10. The semiconductor structure according to claim 9, wherein the arrays are periodically spaced.

11. The semiconductor structure according to claim 1, wherein the third structure comprises an array of elements and wherein the fourth structure is in contact with each element of the third structure.

12. The semiconductor structure according to claim 1, further comprising, in the overlay metrology area and in the second layer, a sixth structure unpinned by any structure in the first layer.

13. A method comprising:
    obtaining an intermediate structure comprising:
        a first layer;
        a second layer on top of the first layer;
        a masking layer over the second layer;
        a device area comprising:
            a first structure in the first layer having a top surface above a top surface of the first layer;
            the second layer in contact with the first structure such that the first structure is pinned in the second layer; and
            a first masking structure in the masking layer, overlapping the first structure; and
        an overlay metrology area comprising:
            a third structure in the first layer having a top surface above the top surface of the first layer;
            the second layer, in contact with the third structure, such that the third structure is pinned in the second layer;
            a second masking structure in the masking layer, overlapping the third structure; and
            a fifth structure in the first layer having a top surface above the top surface of the first layer;
    optically detecting a first distance between a feature of the second masking structure and a feature of the fifth structure;
    etching the second layer, by using the first masking structure and the second masking structure, so as to form a second structure in contact with the first structure, and a fourth structure in contact with the third structure;
    optically detecting a second distance between (1) a feature of the fourth structure that corresponds to the feature of the second masking structure and (2) the feature of the fifth structure; and
    making a comparison of the first distance and the second distance.

14. The method according to claim 13, wherein obtaining the intermediate structure comprises:
    obtaining the first layer comprising the third structure, having a top surface coplanar with the top surface of the first layer; and
    epitaxially growing material of which the third structure is formed on the top surface of the third structure, thereby bringing the top surface of the third structure above the top surface of the first layer.

15. The method according to claim 14, further comprising depositing the second layer on the first layer.

16. The method according to claim 13, wherein obtaining the intermediate structure comprises obtaining, in the masking layer, a third masking structure, not overlapping with any structure for pinning in the first layer,
    the method further comprising optically detecting a third distance between a feature of the third masking structure and a feature of the fifth structure or a feature of the second masking structure, wherein etching the second layer comprises using the third masking structure as a mask to form a sixth structure in the second layer, unpinned by any structure in the first layer,
    optically detecting a fourth distance between the feature of the fifth structure or a feature of the fourth structure corresponding to the feature of the second masking structure, and a feature of the sixth structure corresponding to the feature of the third masking structure, and
    comparing the third distance to the fourth distance to determine a lateral shift of the sixth structure in the second layer unpinned by the first layer.

17. The method according to claim 16, further comprising determining an overlay error for unpinned structures in the first layer and the second layer based on the comparison between the third distance and the fourth distance, and determining the lateral shift attributed to a stress release in the second layer from the comparison of the third distance and the fourth distance and the comparison of the first distance and the second distance.

18. The method according to claim 13, further comprising determining an overlay error for pinned structures in the first layer and the second layer.

19. The method according to claim 18, wherein determining the overlay error comprises determining the overlay error based on the comparison between the first distance and the second distance.

20. The method according to claim 18, further comprising applying the overlay error for pinned structures to reposition a mask pattern used for patterning the masking layer.

* * * * *